United States Patent [19]
McGeer et al.

[11] Patent Number: 5,752,000
[45] Date of Patent: May 12, 1998

[54] SYSTEM AND METHOD FOR SIMULATING DISCRETE FUNCTIONS USING ORDERED DECISION ARRAYS

[75] Inventors: Patrick C. McGeer, Orinda; Alexander Saldanha, El Cerrito; Alberto Sangiovanni-Vincentelli, Berkeley, all of Calif.

[73] Assignee: Cadence Design Systems, Inc., San Jose, Calif.

[21] Appl. No.: 284,157

[22] Filed: Aug. 2, 1994

[51] Int. Cl.$^6$ ................................................. G06G 17/50
[52] U.S. Cl. ........................ 395/500; 364/489; 364/578
[58] Field of Search ................................. 395/500, 600; 364/578, 489, 488, 490; 371/27

[56] References Cited

U.S. PATENT DOCUMENTS

| | | | |
|---|---|---|---|
| 4,527,249 | 7/1985 | Van Brunt | 364/578 |
| 4,694,411 | 9/1987 | Burrows | 364/578 |
| 4,703,435 | 10/1987 | Darringer et al. | 364/489 |
| 4,725,971 | 2/1988 | Doshi et al. | 364/578 |
| 4,782,440 | 11/1988 | Nomizu et al. | 364/200 |
| 4,831,543 | 5/1989 | Mastellone | 364/489 |
| 4,967,367 | 10/1990 | Piednoir | 364/489 |
| 5,051,938 | 9/1991 | Hyduke | 364/578 |
| 5,084,824 | 1/1992 | Lam et al. | 364/490 |
| 5,301,318 | 4/1994 | Mittal | 395/600 |
| 5,384,720 | 1/1995 | Ku et al. | 364/578 |
| 5,392,227 | 2/1995 | Hiserote | 364/578 |
| 5,426,770 | 6/1995 | Nuber | 315/500 |
| 5,477,474 | 12/1995 | Southgate et al. | 364/578 |

FOREIGN PATENT DOCUMENTS 0 397 532 A   11/1990   European Pat. Off. ........ G06F 15/60

OTHER PUBLICATIONS

Miller et al., "Multiple-Valued Logic Design Tools", IEEE, 1993, pp. 2-11.

DeVadas et al., "Optimal Logic Synthesis and Testability Two Faces of the Same Coin", IEEE, 1988, pp. 4-12.

Chakrawarty, "A Characterization of Binary Decision Diagrams", IEEE, 1993, pp. 129-137.

Watanabe et al., "Hewstor Minimization of Mutiple-Valued Relations", IEEE, 1993, pp. 1458-1471.

Miller, "Multiple-Valued Logic Design Tools", IEEE, 1993, pp. 2-11.

Bryant, "Graph Based Algo. for Boolean Function Manipulation," IEEE, 1986, pp. 253-267.

McGeer et al., Fast Discrete Function Evaluation Using D.D, IEEE, 1995, pp. 402-407.

Richard Rudell, "Dynamic Variable Ordering for Ordered Binary Decision Diagrams", 1993 IEEE, pp. 42-47.

*Primary Examiner*—Kevin J. Teska
*Assistant Examiner*—Thai Phan
*Attorney, Agent, or Firm*—Fenwick & West LLP

[57] ABSTRACT

A system and method increases discrete function simulator performance by creating a data structure that completely and accurately models a system of discrete function elements. A discrete function simulator simulates the system using the data structure. Sequential circuits are converted into blocks of combinational elements having latch variables stored to and read from memory. The simulator performance is dependent upon the number of system inputs and outputs and not on the number of discrete function elements in the circuit being simulated.

39 Claims, 7 Drawing Sheets

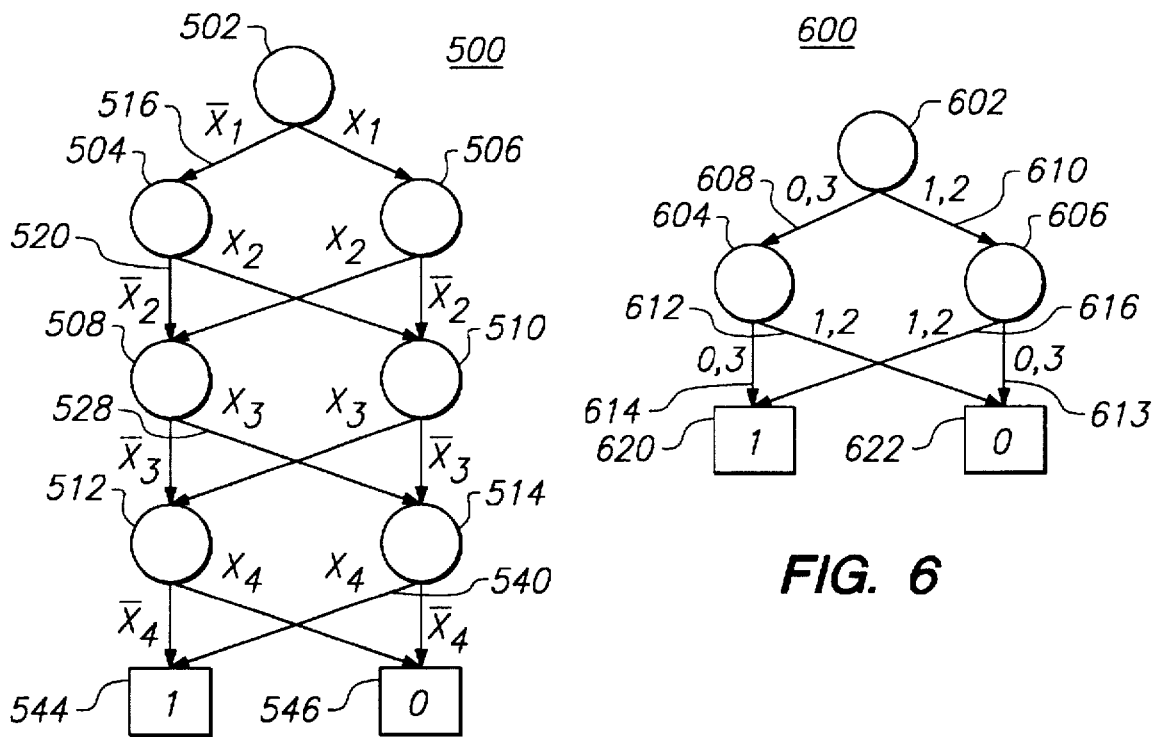
FIG. 5
FIG. 6
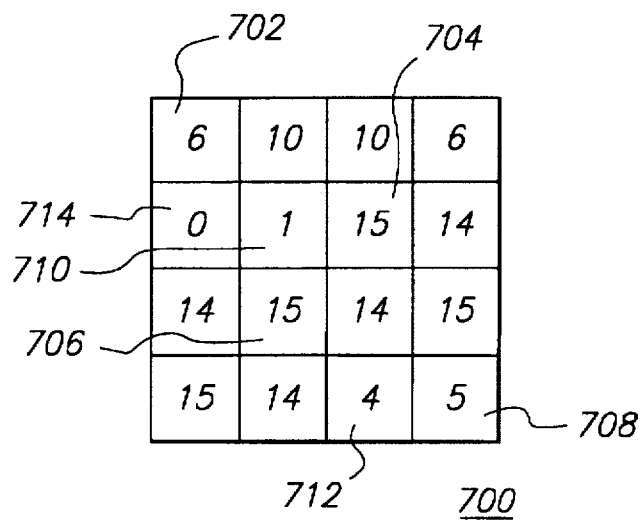
FIG. 7

| 8 | 12 | 12 | 8 |
|---|----|----|---|
| 0 | 1  | 2  | 3 |
| 17| 18 | 18 | 16|
| 19| 17 | 17 | 18|
| 7 | 6  | 5  | 4 |
1500
FIG. 15
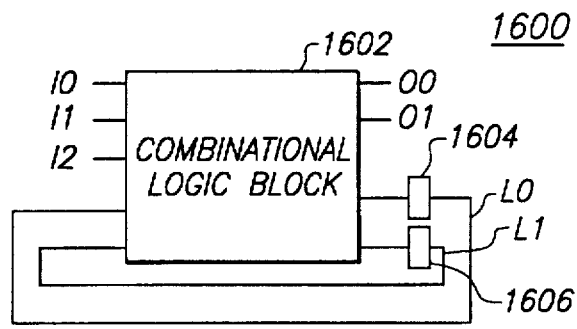
FIG. 16
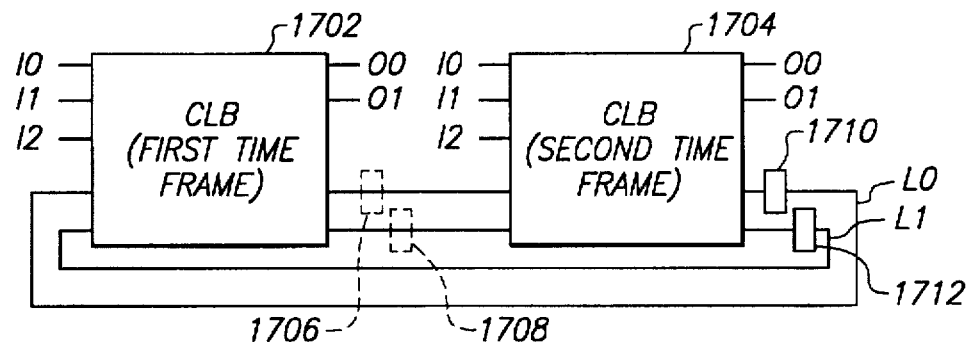
FIG. 17

SYSTEM AND METHOD FOR SIMULATING DISCRETE FUNCTIONS USING ORDERED DECISION ARRAYS

BACKGROUND OF THE INVENTION

1. Field of the Invention

The invention relates generally to the field of electronic design automation (EDA), particularly to systems and methods for improving discrete function simulation in EDA.

2. Description of Background Art

Discrete function simulation is one of the core tasks in rapid system prototyping and debugging in EDA. Improvements in discrete function simulation time can dramatically improve system design time. Discrete function simulators address the problem of finding the values of circuit outputs, given a circuit design and a vector of circuit input values. One example of a discrete function simulator is a logic simulator. Currently, logic simulators in the EDA environment operate in an event-driven manner which is now described. A series of wires connect logic elements within a circuit-under-test. As the input vectors cascade through the logic elements the logical value (1 or 0) of each wire may change. Each change in the value of a wire is regarded as an event. A memory queue stores the events. When the logical value of a wire changes, each gate having the modified wire as an input is subsequently tested to determine if the logical value on the output wire of the gate has changed. A change in the value on this output wire is a new event which is placed in the memory queue. This process continues until all of the gates within the circuit-under-test have been processed.

The performance of conventional logic simulators is dependent upon the number of gates in the simulated circuit. Hundreds of thousands of gates may be present on a single integrated circuit (IC), e.g., an application specific integrated circuit (ASIC). Simulating all of the gates on such an IC requires a significant amount of time.

Accordingly, a logic simulator is needed that significantly decreases the time required to perform large scale logic simulation, and whose performance is independent of the number of gates in the circuit.

SUMMARY OF THE INVENTION

The invention is a system and method for improving discrete function simulation. The invention resides in creating a data structure that completely and accurately models a discrete function. A discrete function simulator simulates the system using this data structure. The simulator performance is dependent upon the number of system inputs and system outputs and not upon, for example, the number of logic gates or the number of events occurring in the system.

Through this invention, the performance of a discrete function simulator increases significantly because the data structure enables the discrete function simulator to simulate complex logic systems by performing a series of address lookups instead of simulating the effect of each gate.

BRIEF DESCRIPTION OF THE DRAWINGS

FIG. 5 is an illustration of a first example of a QRBDD generated by the preferred embodiment.

FIG. 6 is an illustration of a first example of an MDD generated by the preferred embodiment.

FIG. 7 is an illustration of a first example of an MDDA generated by the preferred embodiment.

FIG. 15 is an illustration of a MDDA generated by the preferred embodiment, representing the MDD of FIG. 14

FIG. 16 is an illustration of a sequential circuit simulated by the preferred embodiment.

FIG. 17 is an illustration of unrolled sequential circuit of FIG. 16.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digits of each reference number corresponds to the figure in which the reference number is first used.

The discrete function simulator can be used to simulate designs at various design complexity levels, e.g., functional (architectural) level, logic level, and layout level. In the preferred embodiment the discrete function circuit design has a complexity at the logic level. That is, the preferred embodiment generates a discrete function design simulation program, at the logic level, hereafter a logic level simulator.

The invention is directed to a logic level simulator having a number of innovative features, for example the discrete function simulator isolates clusters of combinational logic and sequential logic, hereafter referred to as combinational logic blocks and sequential logic blocks, respectively, within a circuit being simulated. A data array is generated to represent each combinational logic block. The use of the data array enables the speed of the logic simulation, i.e., the simulator performance, to be independent of the number of discrete function elements, e.g., logic gates, being simulated. Instead, simulator performance is dependent upon the number of inputs and outputs associated with the combinational logic blocks.

Figure 1:
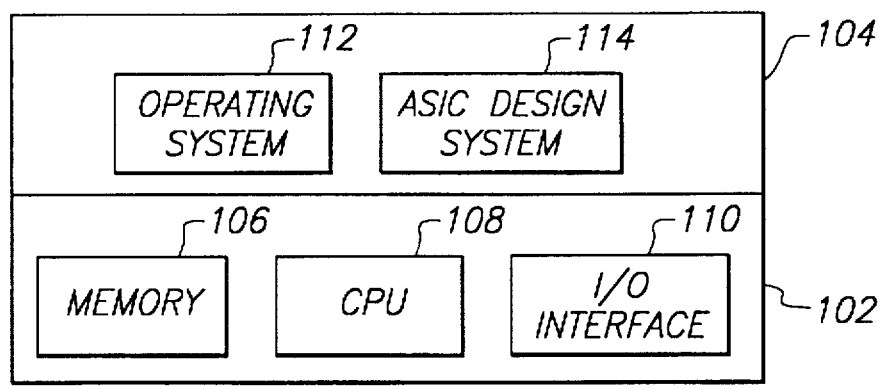
FIG. 1 is an illustration of an environment in which the preferred embodiment resides.

FIG. 1 illustrates an environment in which the preferred embodiment of the present invention operates. The preferred embodiment of the present invention operates on a computer platform 100, e.g., a SPARC station 10 workstation manufactured by Sun Microcomputers, Inc., Mountain View, Calif. The computer platform 100 includes hardware devices 102 and software 104. The hardware devices 102 includes memory 106, one or more central processing units 108 and an input/output (I/O) interface 110. The software of the preferred embodiment includes an operating system 112 and an application specific integrated circuit (ASIC) design system 114. The operation of the computer platform 100 may be controlled by micro-instruction code located in memory 106 and executed using the operating system 112.

The invention simulates digital systems where functional blocks operate atomically. A functional block operates atomically, or in zero time, with respect to a system, when the other components within the system do not to perturb the block while it is computing. Although it is true, for example, that an adder does not compute in zero time, a simulator can assume that the adder operates in zero time if: (a) the adder has completed computing at a time t after the inputs to the adder are perturbed; and (b) the inputs to the adder are perturbed at most every T units of time where T>t. Synchronous systems ensure that (a) and (b) occur. The clock period is defined such that all blocks have completed their computation within the clock period. In synchronous systems the inputs are only perturbed at a clock edge. In addition, burst-mode asynchronous system ensure that (a) and (b) occur.

The present invention can be used to simulate any digital system. The preferred embodiment of the present invention involves logic simulation within an ASIC and is described below.

Figure 2:
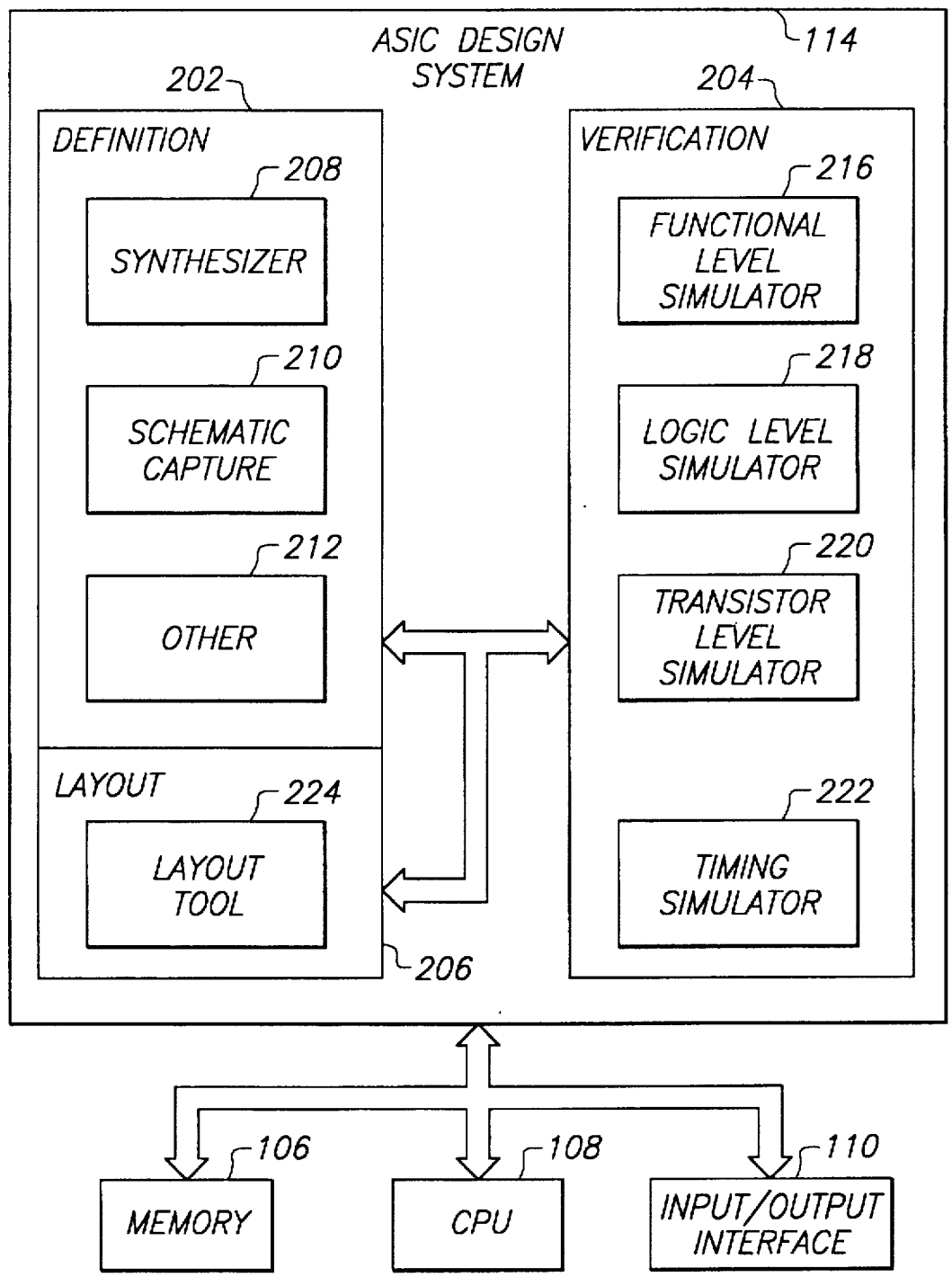
FIG. 2 is an illustration of an ASIC design system in which the preferred embodiment resides.

FIG. 2 is a more detailed illustration of an ASIC design system 114. An ASIC is designed to perform a specific function, in contrast to a microprocessor that can be programmed to perform a variety of functions. An ASIC design system 114 includes three general areas, namely: design definition 202; design verification 204; and design layout 206. A design engineer describes the design of an ASIC at various levels of design sophistication. The levels of design sophistication include the functional level, also termed the register transfer level (RTL) or the architectural level, the logic (gate) level and the transistor (layout) level. When designing at the functional level, the design engineer can describe the design of the ASIC using a hardware description language (HDL) such as Verilog or Very High Speed Integrated Circuit Hardware Description Language (VHDL). It is often desirable to simulate the design at the functional level to ensure that the functional design properly reflects the desired design functions. A functional level simulator 216 performs this type of simulation. In an alternate embodiment, described below, the invention simulates a functional level description.

The design engineer can also input a functional level design by using schematic entry. The design engineer creates a functional block diagram of the desired ASIC by choosing the desired functions from a predefined function library. The library contains a predefined set of functions and the combination of logical elements that defines each function. A schematic capture program 210 replaces each functional block on the computer screen with a combination of logical elements which define the functional block. The schematic capture program 210 converts a functional level design to a logic level design.

Similarly, a design engineer who inputs a functional level design using a HDL, as described above, can convert the functional level design to a logic level design by a process called "synthesis". Synthesis is performed by a synthesizer 208. The output of the synthesizer 208 is a netlist. A netlist is a list of logical elements and a list of the interconnections between these logical elements. A netlist defines the logic level design of the ASIC or other digital system.

Simulating the logic level design is important. Logic design errors that are not detected and repaired at the logic level of the design procedure are expensive and time consuming to fix thereafter in the EDA process. A logic level simulator 218 performs a logic level simulation on the system. The logic level simulator 218 typically receives a netlist that is output from the synthesizer 208, or a netlist that is output from the schematic capture program 210. In addition, the logic level simulator receives a multitude of test vectors that provide the input data necessary to simulate the logic level design. For each test vector the simulator produces one or more outputs that are compared to the desired result. Millions of test vectors may be input into, and simulated by, the logic level simulator 218 to ensure that the logic level design accurately reflects the logical characteristics of the desired ASIC.

After verifying that the logic level design is accurate, the design engineer utilizes a layout tool to create the geometric description of the ASIC. When the ASIC comprises field programmable gate arrays (FPGAs) the design engineer uses the layout tool to define the functions of logic modules within each FPGA. In addition, the design engineer uses the layout tool to define a path for interconnecting the logic modules. When the ASIC comprises a standard cell, the design engineer uses a layout tool called an automatic place and route (APR) routine to define the location of each standard cell within the ASIC and to define the interconnect path between each of the standard cells.

When the layout of the ASIC is complete, the design engineer usually performs a timing simulation using a timing simulator 222. A timing simulation enables the design engineer to detect timing delays which exceed timing constraints that are set by the design engineer. An example of such a timing delay is a delay in signal propagation on a FPGA or between standard cells. The design engineer may perform a timing simulation earlier in the design process, when the ASIC comprises PLDs or PLAs, since the system timing is determined earlier when utilizing these devices.

Figure 3:
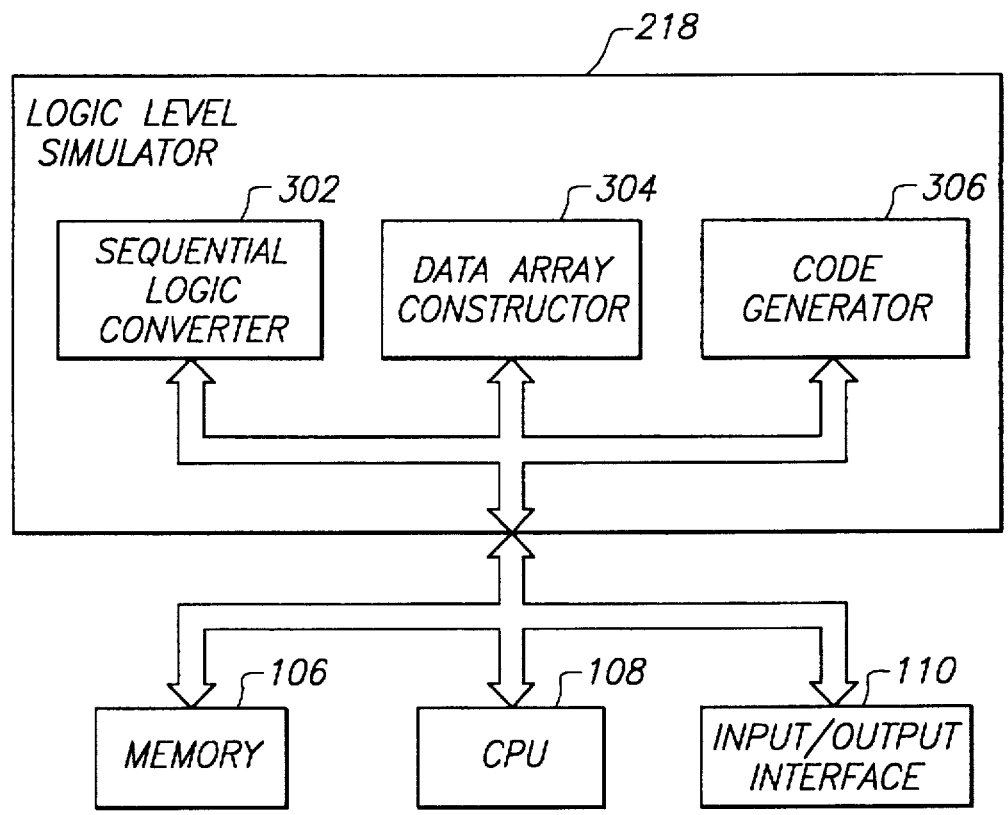
FIG. 3 is more detailed illustration of the logic level simulator of the present invention.

FIG. 3 is a more detailed illustration of the logic level simulator 218 according to the preferred embodiment of the present invention. The logic level simulator 218 retrieves logic level design information from the memory 106. The logic level design information is input into a sequential logic converter 302. The sequential logic converter 302 separates the logic level design information into combinational logic blocks and storage elements, e.g., latches and flip flops.

The data array constructor 304 receives the output of the sequential block converter 302 and creates a data array that reflects the logical characteristics of the logic level design for the circuit under test. The code generator 306 creates CPU executable code from the data array that is output from the data array constructor 204. The CPU accepts test vectors from the input/output interface 110 or the memory 106 and uses the test vectors as input data for the logic level simulator code generated by the code generator 306. Details describing the method used by the sequential logic converter 302, the data array constructor 304, and the code generator 306 are set forth below.

Figure 4:
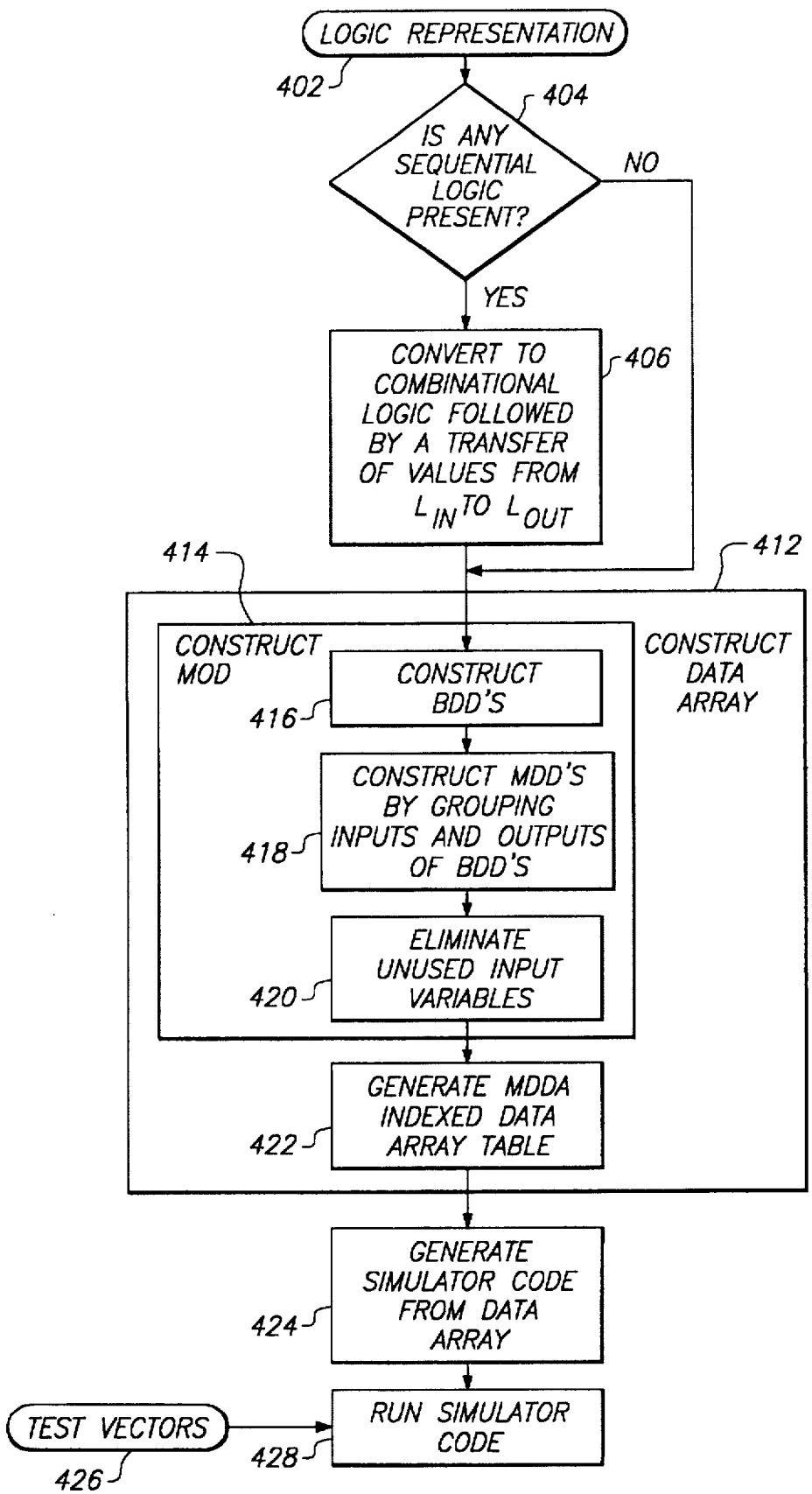
FIG. 4 is a flow diagram illustrating the method of the preferred embodiment.

FIG. 4 illustrates the preferred embodiment for the method of the invention. A logic representation of a digital circuit 402, e.g., an ASIC, is input into the system. The form of the logic representation can be a netlist, a logic equation, a truth table, a HDL description, a schematic, or any other form that represents the functional characteristics, e.g., logical characteristics, of the circuit under test. The sequential logic converter 302 determines 404 whether the logic representation is a sequential logic representation or a combinational logic representation. A combinational logic circuit is a circuit with external output signal(s) that are dependent only upon the external input signals applied to the circuit. A sequential logic circuit is a circuit having the present state output signal dependent upon all or part of the present state output signals that are fed back as input signals to the combinational logic representation.

If the logic representation is a combinational logic representation of the ASIC, the logic level simulator 218 simulates the discrete function, e.g., the logic, using a table look up. The preferred embodiment of the present invention constructs a look-up table by constructing a data array that reflects the logical characteristics of the logic level design. Alternate techniques for constructing the look-up table, e.g., creating a truth table for the outputs based on the inputs can be utilized. Data array construction 412 can be sub-divided into several steps. The data array constructor 304 creates 414 a multivalued decision diagram. Steps 416–420 detail the method used to create a MDD.

Creating 414 a MDDA involves constructing 416 a Quasi-Reduced Binary Decision Diagram (QRBDD). Other diagrams can be used in this step such as Binary Decision Diagrams (BDD), Binary Moment Diagrams, Free BDDs, Zero-suppressed BDDs, Quasi-reduced BDDs, Algebraic Decision Diagrams, Edge-valued BDDs, Kronecker Decision Diagrams and Shannon Trees to name a few. A QRBDD differs from a BDD in that in a QRBDD every node need not have two distinct children. In addition, in a QRBDD each branch of the structure must have a node on each level. QRBDDs are discussed in detail below.

A technique for constructing a QRBDD from the logic level representation 402 is now discussed. A set of logic functions are created from the logic level representations 402. Each logic function (F) represents one output, e.g., $O_i$ Each output value is a function of some or all of the inputs, i.e., $x_1, \ldots, x_n$ where there are "n" inputs. For an $i^{th}$ output the output equation can be written as: $O_i=F(x_1, \ldots, x_n)$. This can be written in the form:

$$O_i=F(x_1, \ldots, x_n)=(x_1 \wedge F(x_1=1)) \vee (x_1 \wedge F(x_1=0)) \quad \text{Eq. (1)}$$

Since $F(x_1=1)$ and $F(x_1=0)$ are both functions over the variables $(x_2, \ldots, x_n)$ the logic level simulator 218 expands these functions in a similar manner. This expansion results in a binary "tree" of functions whose "leaves" are the constant functions 1 and 0. The left "child" of a node, G, at level j in this "tree" is the function obtained by evaluating G at j=0, and the right "child" is the function obtained by evaluating G at j=1. The same sequence of variables is used along every path from the "root" of the tree to the leaves. For example, in FIG. 5, discussed below, the sequence of variables is: $x_1, x_2, x_3, x_4$. The resulting nodal tree contains many nodes which represent equal functions. Combining nodes having equal functions results in a directed acyclical graph, i.e., a QRBDD.

In the preferred embodiment the QRBDD's are constructed from the logic level representation using a technique that is more efficient than the technique described above. The more efficient technique is described in Brace, EFFICIENT IMPLEMENTATION OF A BDD PACKAGE 27 ACM/IEEE *DESIGN AUTOMATION CONFERENCE* 40–45 (1990), which is incorporated herein in its entirety, and Bryant, Graph-Based Algorithms for Boolean Function Manipulation, C-35 IEEE *TRANSACTIONS ON COMPUTERS* 677–691 (August, 1986) which is incorporated herein in its entirety.

The present invention enhances the technique described in Brace by incorporating the differences, described above, between a QRBDD and a BDD and by reducing the size of the constructed QRBDD's. The reduction in QRBDD size is accomplished using two techniques.

First, the size of the QRBDD is dependent on the ordering of the variables used in the QRBDD. The problem of finding the variable order that minimizes QRBDD size is discussed with respect to BDDs in Bryant. Several heuristic algorithms that determine a good variable order for a BDD include Malik et al., LOGIC VERIFICATION USING BINARY DECISION DIAGRAMS IN A LOGIC SYNTHESIS ENVIRONMENT, Proceedings of the IEEE International Conference on Computer-Aided Design, 6–9 (1988), and Fujii et al. INTERLEAVING BASED VARIABLE ORDERING METHODS FOR ORDERED BINARY DECISION DIAGRAMS, Proceedings of the IEEE International Conference on Computer-Aided Design, 38–41 (1993). These automated heuristic algorithms can be used on QRBDDs and are dependent on the structure of the Boolean network for which the QRBDD is being built. Under the same heuristic ordering algorithm two different structural representations of the same network may yield QRBDD's that are significantly different in size. Performing logic optimization before applying the heuristic ordering algorithm typically yields QRBDD's of smaller size. The present invention uses this fact by using logic synthesis and optimization before constructing the QRBDD's. Thus, given an initial design that is to be simulated, synthesis and logic optimization is first performed to obtain an optimized logic structure from which the QRBDD ordering is derived. A feature of the present invention is the use of synthesis and optimization before generating the discrete function simulation program based on a circuit design, wherein a given circuit design is possibly completely altered and modified using simulation before it is simulated.

The second technique for reducing the size of the QRBDD's is implemented when the size of the QRBDD is very large under all possible variable orders. Frequently, a variable ordering that results in a small QRBDD size may not be found. Large QRBDD sizes imply a large data array. A large data array may exhaust the available memory on the computer. A solution to this problem is to partition the circuit into a series of pipelined executions. This "pipelining" of a circuit conceptually operates as follows. The circuit is first partitioned into stages, each of which describes the combinational functions of its outputs in terms of its inputs. The output of each stage is a combinational function that is dependent upon only the outputs of earlier stages and/or the primary inputs of the circuit. The outputs of the given design are now computed as the outputs of the last stage in the pipelined circuit. In order to obtain an automatic partition of a circuit when the QRBDD's for the circuit are too large, logic synthesis is utilized to provide an optimized structure on which the partitioning algorithm performs. The partitioning algorithm begins a new design stage when the current design stage reaches a predefined size threshold. The same algorithms used for partitioning a circuit for logic optimization during synthesis may be utilized in obtaining partitions for pipelined evaluation during simulation.

FIG. 5 is an illustration of a QRBDD for the canonical function represented by equation (2).

$$O_1=F(x_1, x_2, x_3, x_4)=\overline{x}_1x_2x_3x_4 \vee \overline{x}_1\overline{x}_2x_3x_4 \vee \overline{x}_1\overline{x}_2\overline{x}_3x_4 \vee \overline{x}_1x_2x_3x_4 \vee x_1\overline{x}_2x_3x_4 \vee x_1\overline{x}_2x_3\overline{x}_4 \vee x_1x_2\overline{x}_3x_4 \vee x_1\overline{x}_2\overline{x}_3\overline{x}_4=1 \quad \text{Eq. (3)}$$

The circles 502–514 represent nodes of the QRBDD. Each node represents a function over the variables "below" the node. For example, the variables $x_1$ and $x_2$ are used to reach node 508. Therefore, node 508 represents a function over the variables $x_3$ and $x_4$, i.e., the variables below node 508. The arrows 516–540 represent the possible paths between nodes. The following example illustrates the technique for using a QRBDD to determine the value of a function. Using the function described by equation (2), if $F(x_1, x_2, x_3, x_4)=F(0, 0,1,1)$ then the function is traced as follows. Beginning at node 502, the first variable in the variable sequence is $x_1$. The value of $x_1$ is zero (0). Therefore, the use of path 516 leads to the function represented by node 504. The next variable is $x_2$. The value of $x_2$ is zero (0). Therefore, use of the path 520 leads to the function represented by node 508. The next variable is $x_3$. The value of $x_3$ is one (1). Therefore, use of the path 528 leads to the function represented by node 514. The next variable is $x_4$. The value of $x_4$ is one (1). Therefore use of the path 540 leads to the function represented by the leaf 544. Leaf 544 represents the constant function having the value of one (1). Therefore, the value of the function $F(0,0,1,1)$ is one (1). The logic level simulator 218 can create a binary decision data array (BDDA), not shown, representing each QRBDD. Each BDDA represents a combinational logic block and the leaves represent one combinational logic block output.

The logic level simulator 218 converts 418 each BDDA to a multi-valued decision data array (MDDA). A MDDA is a generalization of a BDDA. Specifically, a MDDA node may have more than two children, described below, and more than two leaves, i.e., the MDDA need not only represent binary functions. The conversion from a BDDA to a MDDA can be described graphically by converting a QRBDD to a quasi-reduced multi-value decision diagram (MDD). Any QRBDD implicitly represents a number of MDDs. Specifically, the binary input variables can be grouped in any manner to obtain an MDD. For example, referring to the QRBDD illustrated in FIG. 5, a single MDD variable, $y_1$, can represent binary variables $x_1$ and $x_2$. In this situation the variable $y_1$ will have a value in the range of $\{0, \ldots, 3\}$. Similarly, $y_1$ can represent binary variables $x_1, x_2,$ and $x_3$. In this example the variable $y_1$ will have a value in the range of $\{0, \ldots, 7\}$. In the example illustrated by FIG. 6, the logic level simulator 218 creates two MDD variables: $y_1$, representing binary variables $x_1$ and $x_2$; and $y_2$, representing variables $x_3$ and $x_4$ from equation (2). The representation of output $O_1$ is, therefore, a function of MDD variables $y_1$ and $y_2$, i.e., $O_1=F(y_1,y_2)$. Equation (3) represents the function described in equation (2) using MDD variables.

$$O_1 = F(3,3)=F(0,3)=F(1,1)=F(1,2)=F(2,1)=F(2,2)=F(3,0)=F(0,0)=1 \quad \text{Eq. (3)}$$

FIG. 6 illustrates the MDD for equation (3). Circles 602–606 represent the nodes of the MDD. Arrows 608 and 610 represent paths taken from node 602 depending upon the value of $y_1$. Arrows 612–618 represent the paths taken depending upon the value of $y_2$. Boxes 620 and 622 represent the leaves of the MDD, i.e., the constant functions one (1) and zero (0). The following example illustrates the technique for using a MDD to determine the value of a function. Using the same values as the QRBDD example, i.e., $F(0,3)$, begin a t node 602. The value of $y_1$ is zero (0). Therefore, using path 608 leads to the function represented by node 604. The next variable is $y_2$. The value Of $y_2$ is three (3). Therefore, using path 614 leads to the function represented by the leaf 620. Leaf 620 represents the constant function having the value of one (1). Therefore, the value of the function $F(0,3)$ is one (1).

The transformation of a QRBDD to a MDD assumes that for each set of outputs, every group of input variables must be evaluated. However, in large circuits a particular output variable is often independent of the value of one or more groups of input variables. If a MDD is independent of an entire group of input variables, this group of input variables need not be included in the MDD. The logic level simulator 218 eliminates 420 unused input variables from the MDDA. The elimination 420 of unused input variables can occur after the MDDA output grouping, described below.

As stated above, the logic level simulator 218 converts 418 each QRBDD to a MDD. In the preferred embodiment of the present invention the logic level simulator 218 generates 422 and stores each MDDA as an array table of integers. FIG. 7 illustrates the MDDA for the MDD of FIG. 6. The MDDA is a collection of sub-arrays with each node in the MDDA forming a sub-array. The size of a particular sub-array is the number of possible values for a variable associated with the given node. If the sub-array for node N begins at position i of the array, and the associated variable for node N has values in the range of $\{0, \ldots, k\}$, then the sub-array for node N is the table having the values at the array positions $\{i, \ldots, i+k\}$. The value of the entry at position $\{i+j\}$ of the table is the root index of the sub-array of node M, where M is the $j^{th}$ child of N.

FIG. 7 is an example of a MDDA for the MDD 600 of FIG. 6. The MDDA table has sixteen entries. Entries 0 . . . 3 are the entries for the root node 602. Entries 6 . . . 9 are the entries for node 604. Entries 10 . . . 13 are the entries for node 606. Entries 14 and 15 are the entries for the leaves 622 and 620, respectively. Each leaf is treated as a node having a single child. Entry 4, 714, is the child of node 622. Entry 5, 710, is the child of node 620.

As stated above, the values of a MDDA are defined to represent a combinational logic block. The logic simulator 218 receives the test vectors 426. In the preferred embodiment, the binary input variables from the test vectors are packed into registers. In an alternate embodiment the variables are not packed into registers in order to permit the use of a single binary variable in several different MDD variables. A set of binary input variables corresponds to a single MDDA variable, e.g., $y_1, y_2$. The logic level simulator 218 stores the binary input variables in big-endian order, i.e., the most significant bit is the highest bit of a register. The logic level simulator 218 masks all non-relevant bits from the register and shifts the remaining bits to the low-order bits of the register in order to obtain the value of the MDDA variable. The logic level simulator 218 converts binary input variables to MDDA variables and performs, at most, one MDDA table lookup per MDDA variable. The logic simulator 218 stores the root index of the current node in a variable, e.g., a variable called ptr. If the current node has a root index equal to i and the current MDDA variable has a value equal to j then the value of the MDDA table at the position [i+j] is equal to the root index of the child node of N which is to be traversed based upon the MDDA variable value.

As stated above, FIG. 7 illustrates an example of an MDDA for the function described in equation (3). The logic simulator 218 reads the ptr variable to determine the value of the root index of node 602 for the function $F(0,3)$. For this example, the root index is defined to be zero (0). The value of variable $y_1$ is zero (0). Therefore, the root index of the next child node is equal to the value of the table at first index. The first index is the position that is equal to sum of the value of the current root index, i.e., zero (0), and the value of the MDDA variable, i.e., zero (0). The value of the MDDA table at the first index, i.e., position zero, is six (6) 702. Therefore, the new current root index is six (6).

As stated above, entries 6 ... 9 are entries associated with node 604. The logic simulator 218 reads the value for the next MDDA variable. In this example the next MDDA variable is $y_2$. $y_2$ has a value of three (3). The logic simulator determines the new current root index by adding the value of the current root index, i.e., six (6) and the value of the current MDDA variable, i.e., three (3), and determining the MDDA table value at this position. The MDDA table value at position nine (9), i.e., 6+3, is fifteen (15) 706. Therefore, the new current root index is fifteen (15).

The logic level simulator 218 determines that no more MDDA variables need to be evaluated. In order to determine the value of the function F(0,3), the logic level simulator 218 continues reading the MDDA table with the current root index value of fifteen (15) and a MDDA variable value of zero (0). The new root index is the value of the MDDA table at the position equal to the current root index (15) and the MDDA variable (0). Therefore, the new root index the value of the MDDA at position 15, i.e., five (5) 708. The value of the output value $O_1$ based upon the MDDA input values is at position 5 in the MDDA table. In this example $O_1=1$.

In an alternate embodiment, the value of entries 712 and 708 are replaced with the values zero (0) and one (1), respectively. When reading the MDDA the logic simulator traverses the MDDA for one less iteration to achieve the same result.

In the preferred embodiment, the code generator 306 generates a computer program having the following form:

| | |
|---|---|
| 1. | ptr = root_index; |
| 2. | mdd_var = input & input_mask1; /* mask off the first mdd variable */ |
| 3. | mdd_var = mdd_var >> input_shift1; /* shift into the low-order position */ |
| 4. | ptr = table[ptr + mdd_var]; /* index and update table_ptr */ |

Lines 2–4 are repeated once per MDDA variable. The value of the input_mask and input_shift variables differ for each MDDA variable.

The implementation of lines 2–4 yields 4–5 machine instructions, depending upon details of the machine architecture. However, it is typically not fewer than 4 machine instructions nor greater than 5 machine instructions. These lines are repeated once per MDDA variable. The total number of instructions required to evaluate a single-output function under this method is therefore 5n.

Figure 8:
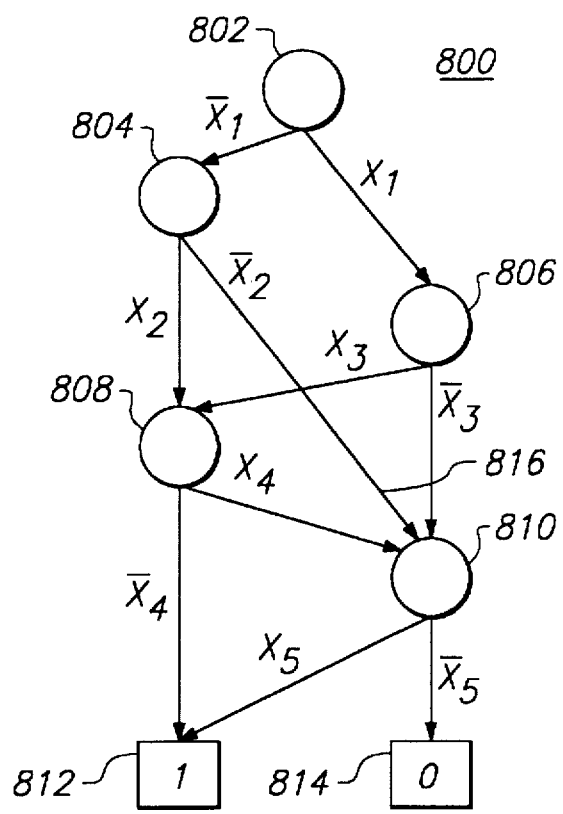
FIG. 8 is an illustration of a second example of a QRBDD generated by the preferred embodiment.
Figure 9:
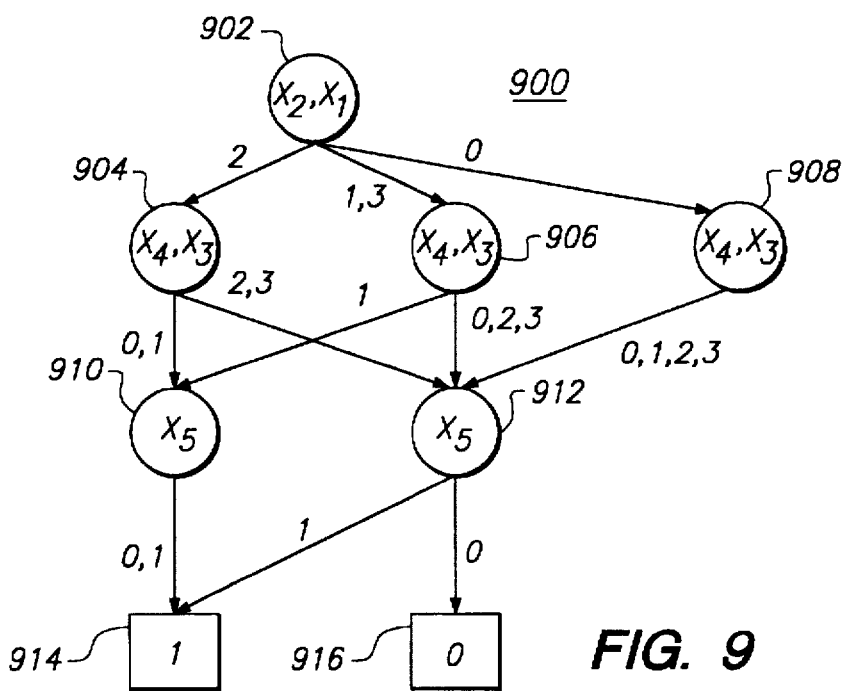
FIG. 9 is an illustration of a second example of an MDD generated by the preferred embodiment.

A feature of the invention is the technique for recovering one or more MDDAs from one or more BDDAs. FIG. 8 illustrates a QRBDD 800 for a function (F) over five input variables ($x_1-x_5$), i.e., $F(x_1, x_2, x_3, x_4, x_5)$. An MDD can be created from the QRBDD 800 by grouping the input variables as follows: $\{x_1, x_2\}$, $\{x_3, x_4\}$, $\{x_5\}$. FIG. 9 illustrates the MDD created by such an input variable grouping. For all nodes in the QRBDD associated with a first input variable in a group, i.e., variables $x_1$, $x_3$ and $x_5$, there is a corresponding node in the MDD. Node 802 in the QRBDD is associated with the input variable $x_1$. Node 902 in the MDD corresponds to node 802. Node 806 in the QRBDD is associated with the input variable $x_3$. Node 906 in the MDD corresponds to node 806. Node 810 in the QRBDD is associated with input variable $x_5$. Node 912 in the MDD corresponds to node 810. Node 808 in the QRBDD is associated with input variable $x_4$. Node 808 has an incoming arrow from a node 804 which is associated with a variable in a different MDD grouping. Therefore, an MDD node corresponding to QRBDD node 808 is necessary. Node 910 in the MDD corresponds to node 808.

An incoming edge, represented by arrow 816 in FIG. 8, connects node 804 and 810 without reference to the second group of input variables, i.e., $x_3$ and $x_4$. When defining a MDD an input variable group should not be skipped along any possible path from the root node 902 to the leaves, 914, 916. Therefore, additional MDD nodes are defined, ensuring that all possible root node-to-leaves path account for each group of input variables. In the present example, two nodes 908, 910 are defined, having constant functions, to satisfy the above requirement. These nodes are called "filler" nodes.

The system and method for grouping 418 binary inputs together into a single MDD variable, discussed above, reduces computation time by a factor of k, where k is the average number of inputs grouped to form a single MDD variable. There is a tradeoff, however. Since each group of k binary variables can assume $2^k$ possible values, the size of the relevant MDDA can increase by a factor approaching $2^k$. The increase in MDDA size decreases system performance. In the preferred embodiment, having k equal to 5 results in the best performance. However, other values for k, e.g., 1–10, can be used without departing from the spirit and scope of the present invention.

The above discussion relates to simulating a logic circuit having a single binary output. Typically, circuits have more than one binary output. For example, the logic that implements finite-state machines can be expected to have as many inputs as outputs. A typical circuit has approximately 100 inputs and 100 outputs.

After grouping the input variables 418, described above, a separate MDDA exists for each output variable. A property of an MDDA is that it can have multiple terminals as well as multiple edges from each node. A terminal is a node having no outgoing edges. An edge is a link between two nodes. This property enables the data array constructor 304 to associate 418 two or more outputs variables with one MDDA. For example, the function described in equation (2) represents one output, i.e., $O_1$. We define a second function representing a second output, $O_2$ as shown in equation (4).

$$O_2=F(x_3, x_4)=x_3x_4=1 \qquad \text{Eq. (4)}$$

Figure 10:
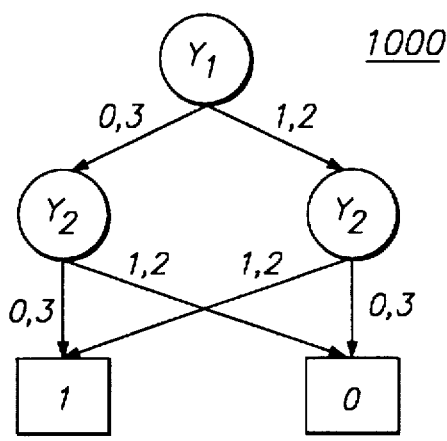
FIG. 10 is an illustration of a second example of an MDDA generated by the preferred embodiment.
Figure 11:
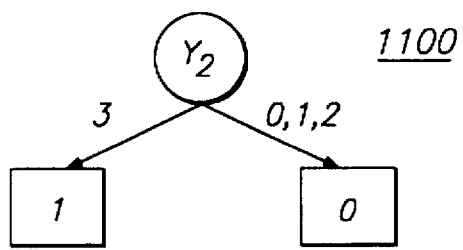
FIG. 11 is an illustration of a third example of an MDDA generated by the preferred embodiment.
Figure 12:
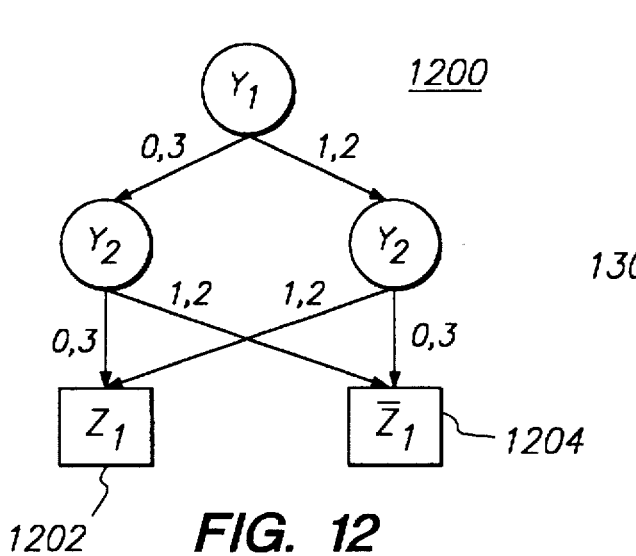
FIG. 12 is an illustration of the second example of an MDDA having output variables representing the leaves.
Figure 13:
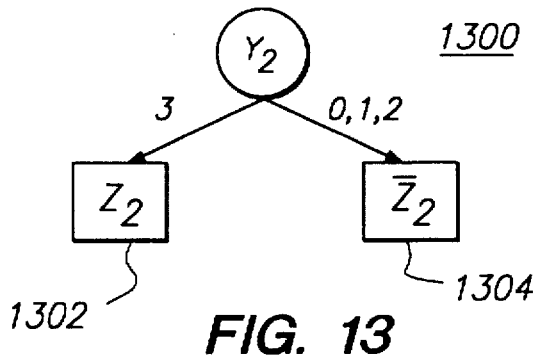
FIG. 13 is an illustration of the third example of an MDDA having output variables representing the leaves.

The MDDs 1000, 1100, representing the functions defined by equation (2) and equation (4) are illustrated in FIG. 10 and FIG. 11, respectively. In order to combine the output variables, i.e., $O_1$ and $O_2$, a single MDD is created that represents both functions. Two output variables, $z_1$ and $z_2$ representing $O_1$ and $O_2$, are defined as the leaves 1202, 1204, 1301, 1304 of the MDDs. The MDDs 1200, 1300, having the new variables are illustrated in FIG. 12 and FIG. 13.

The data array constructor 304 combines the MDDs. In the preferred embodiment the MDDs are combined by taking their intersection using an adaptation of a recursive descent algorithm. The recursive descent algorithm used is described in Srinivasan et al., ALGORITHMS FOR DISCRETE FUNCTION MANIPULATION, Proceedings of the Seventh International IEEE Conference on Computer-Aided Design, 92–95 (1990), whose ideas were adapted from Bryant, Graph-Based Algorithms for Boolean Function Manipulation, C-35 IEEE TRANSACTIONS ON COMPUTERS 677–691 (August, 1986).

Figure 14:
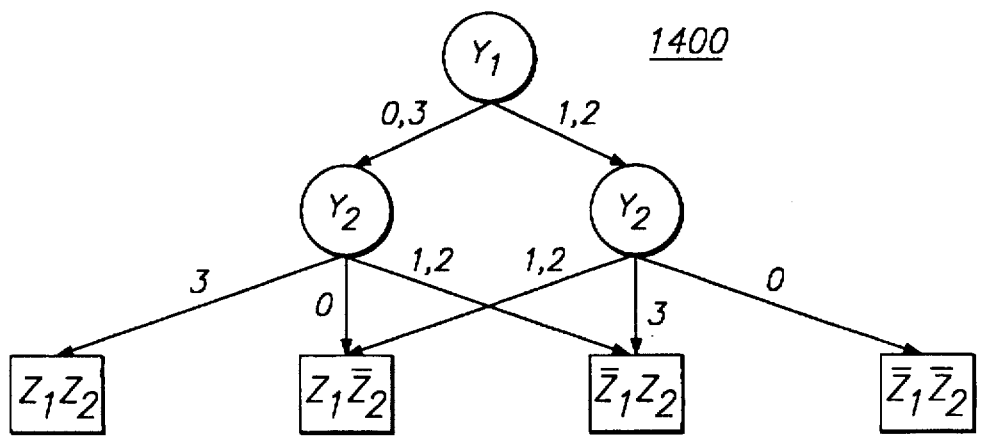
FIG. 14 is an illustration of a MDD representing the intersection of the MDD's of FIG. 12 and FIG. 13.

Combining MDDs 1200 and 1300 results in MDD 1400 illustrated in FIG. 14. Srinivasan et al. does not disclose a technique for converting QRBDDs to MDDs. Converting a QRBDD to an MDD involves grouping input variables. The choice of input variables grouping can significantly affect the efficiency of the recursive algorithm, e.g., significant storage savings can result from properly grouped input variables. A feature of the present invention is a technique for grouping input variables and output variables. The QRBDDs are iteratively grouped together into a multi-terminal binary decision diagram (MTBDD). A MTBDD is a QRBDD having more than two terminals. The QRBDDs are grouped and the number of variables on which each MTBDD depends is determined as shown in equation (5).

$$\sum_i Support(MTBDDi) \qquad \text{Eq. (5)}$$

The quantity defined by equation (5) is minimized using the Greedy algorithm which is described in G. DE MICHELI, *SYNTHESIS AND OPTIMIZATION OF DIGITAL CIRCUITS* 51–53(1994) which is incorporated herein in its entirety. First, pairs of QRBDDs are formed, then the QRBDD pairs having the smallest support value are determined using equation (5). The QRBDDs pairs having the smallest support value are combined to form four-terminal QRBDDs. Each QRBDD is used in at most one QRBDD combination pair. QRBDD pairs are then combined in the same manner as QRBDDs are combined, described above. The process continues until the MTBDDs grow to a set limit in size, e.g., combining 5 output variables, or until no reduction in equation (5) results from additional grouping. Input variables are grouped using the same technique.

The data array constructor 304 constructs the MDDA 1500 illustrated in FIG. 15 from the MDD 1400. The technique for traversing through an MDDA is discussed above with reference to FIG. 7.

The system and method for grouping output variables, described above, reduces computation time by reducing the number of MDDAs. However, as is the situation with combining input variables, output variable grouping increases MDDA size. In the preferred embodiment grouping 5–8 output variables for each MDDA results in optimal performance. However, the results vary significantly depending on the circuit under simulation.

Experimental results indicate that the present system and method, using input variable grouping and output variable grouping can increase system performance by over twenty-five hundred percent.

Typically, after grouping multiple outputs, several MDDAs are present. In the preferred embodiment, if k MDDAs are present after grouping output variables, each MDDA is stored in a variable, e.g., the variables table1... tablek. The current indices, for the MDDAs, are stored in the variables ptr1... ptrk. The logic level simulator 218 implements a computer program having the following form:

| | |
|---|---|
| 1. | ptr = root_index |
| 2. | mdd_var = input & input_mask1; /* mask off the first MDD variable */ |
| 3. | mdd_var = mdd_var >> input_shift1; /* shift into the low-order position */ |
| 4a. | ptr1 = table1[ptr1 + mdd_var]; /* index and update table_ptr */ |
| 4b. | ptr2 = table2[ptr2 + mdd_var]; |
| ... | |
| 4k. | ptrk = tablek[ptrk + mdd_var]; |

Lines 2–4k are repeated for each MDDA input variable. The implementation of lines 2–3 yield 2 instructions/MDD variable/MDD. The implementation of lines 4a–k yields 2 instructions/MDD variable.

The above discussion details the system and method of the invention when a combinational circuit is simulated. The invention can also simulate sequential circuits. FIG. 16 illustrates an example of a sequential circuit. If the sequential logic converter 302 determines 404 that the circuit being simulated is a sequential logic circuit the sequential logic converter 302 automatically converts 406 the sequential logic circuit to one or more combinational logic blocks 1602 and one or more sequences of latch variable transfers to and from memory 106. A latch variable is a variable that is output from and input to the same combinational block 1602 or is output from one combinational block 1602 and input into a sequential block or a different combinational block.

The following example illustrates the latch variable read and store operations. The MDDA inputs for a sequential circuit are $\{i_1, i_2, i_3, i_4\}$, the MDDA outputs are $\{o_1, o_2, o_3, o_4, o_5\}$, and the latch variables are $\{L_1, L_2, L_3\}$. If the maximum allowed input grouping size is restricted to 2, and the order chosen for building the QRBDD's is $\{i_3, L_2, L_1, i_2, i_4, i_1, L_3\}$, then the largest input grouping possible is $\{i_3, L_2\}, \{L_1 i_2\}, \{i_4, i_1\},$ and $\{L_3\}$. In this example, the values of the outputs $\{L_2, L_1, L_3\}$ are transferred to corresponding input groups $\{L_2, L_1\}$ and $\{L_3\}$ using two shift and mask operations. The latch variable ordering restriction improves the speed of the logic level simulator 218.

Further optimization across latch boundaries is possible for sequential circuits. This is accomplished by a technique called unrolling. Unrolling a circuit for the purposes other than circuit simulating, e.g., circuit analysis and automatic test pattern generation (ATPG), is described in Breuer & Friedman, *DIAGNOSIS AND DESIGN OF DIGITAL SYSTEMS*, 90–109 (1976) which is incorporated herein in its entirety.

FIGS. 16 and 17 illustrate the unrolling technique on a sequential circuit 1600. The sequential logic converter 302 converts a sequential circuit 1600 to a combinational logic block (CLB) 1602 and a sequence of latch variable transfers. In the preferred embodiment, the latches 1604, 1606 are simulated by storing the latch variables L0, L1, that are output from the CLB 1602 in memory during a first clock cycle of the simulation. At the next clock cycle, the latch variables L0, L1 are read from the memory, in the same sequence as they are stored, and are input into the CLB 1602. A full clock cycle is necessary to store the latch variables L0, L1, in memory 106 and to output the latch variables L0, L1, from memory 106. Another feature of the present invention is the elimination of this clock cycle delay for some sequential circuits.

The sequential circuit illustrated in FIG. 16 has three BDDA input variables (I0, I1, I2), two BDDA output variables (O0, O1), and two latch variables (L0, L1). The circuit may be unrolled over two time frames to yield the circuit shown in FIG. 17. The resulting circuit is a sequential circuit with six BDDA inputs, four BDDA outputs and two latch variables.

The unrolled circuit is obtained by duplicating the original circuit and connecting the outputs corresponding to the latches 1706, 1708 of the first time frame to the inputs corresponding to the latches of the second time frame. Note that the latches between the first and second time frame, i.e., latches 1706, 1708 are no longer necessary, therefore they are eliminated. These latches, 1706, 1708, can be removed without altering the integrity of the system since the first time frame serves to provide the same logic values, i.e., L0, L1 to the CLB in the second time frame as the CLB 1602 does in the unrolled circuit, FIG. 16. The latches 1710, 1712 of the CLB 1704 associated with the second time frame are input to the CLB 1702 associated with the first time frame. The simulation of CLB 1702 occurs during a first clock cycle, the outputs of CLB 1702 are input directly into CLB 1704 during the next clock cycle. Therefore, the one clock cycle delay described above is eliminated. As a result, the combination of CLB 1702 and CLB 1704 are interpreted by the sequential logic converter 302 to be one combinational logic block.

The technique for simulating the unrolled circuit illustrated in FIG. 17 is now described. Given a sequence of input vectors $v_0, v_1, v_2, \ldots, v_n$, to be simulated on the CLB 1602, the input vector v1, i.e., inputs I0, I1, and I2, is placed on input lines of CLB 1704. That is, at the second time frame. The output of CLB 1702 at the first time frame corresponds to the simulation result for input vector $v_0$. The output of CLB 1704 at the second time frame corresponds to the simulation result for input vector $v_1$. Thereafter, input vectors $v_3$ and $v_4$ are applied to the CLB 1702 and CLB 1704, respectively. The results of the simulation, i.e., O0, O1, correspond to the results of two simulation cycles, i.e., for input vectors $v_3$ and $v_4$ in CLB 1602. In general terms, if input vector $v_{2n}$ is fed to the inputs of CLB 1702 and input vector $v_{2n-1}$ is fed to the inputs of the second time frame, the outputs O0, O1, associated with CLB 1702 correspond to the simulation results for the input vector $v_{2n}$, and the outputs O0, O1 associated with CLB 1704 correspond to the simulation results for input vector $v_{2n-1}$.

The technique can be generalized to perform unrolling for an arbitrary number of clock cycles, subject to constraints on an increase in area and QRBDD sizes that can be tolerated in the resulting unrolled circuit. To unroll over n cycles, n copies of the circuit 1600 are connected in series with the latches of the CLB associated with the $n^{th}$ time frame, corresponding to latches 1710, 1712 in FIG. 17, fed back to the inputs of the CLB 1702, associated with the first time frame. The internal latches, corresponding to latches 1706, 1708 are eliminated. Therefore, the time delay that would have resulted from latches 1706, 1708 is eliminated.

In an alternate embodiment the BDDAs are generated using BDDs instead of QRBDDs. When using BDDs the filler nodes, described above, are not necessary. Therefore, the filler nodes are not generated and the variable represented by a node is encoded within all pointers to the node. When BDDs are used the system utilizes branching instructions to determine the output value from the MDDA. The amount of memory, e.g., cache, required by the system when using BDDs is significantly reduced when compared to QRBDDs.

In another alternate embodiment the discrete function simulator simulates at a functional level. A functional description of a circuit-under-test is converted into a MDD using the technique described in Srinivasan et al., ALGORITHMS FOR DISCRETE FUNCTION MANIPULATION, Proceedings of the Seventh International IEEE Conference on Computer-Aided Design, 92–95 (1990) which is incorporated herein in its entirety. After forming the MDDs the MDDAs are generated as described above.

The present invention increases logic simulator performance by modeling a circuit, using a MDDA, such that the logic simulator performance is dependent upon the number of system inputs and outputs and not on the number of logical gates being simulated.

What is claimed is:

1. A method for simulating a discrete function circuit design, on a digital computer, the discrete function circuit design including two or more discrete function elements, said discrete function circuit design having a plurality of inputs and a plurality of outputs, the method comprising the steps of:

generating a multi-valued decision data representation having a plurality of nodes, representing the circuit design, a size of said multi-valued decision data representation is not dependent upon the number of discrete function elements;

generating a first data array, using the digital computer, wherein said first data array represents an effect of the two or more discrete function elements on the plurality of inputs, wherein said first data array includes a plurality of data tables, each of said tables identified with one of said plurality of nodes, said first data array having a size that is not dependent upon the number of discrete function elements; and traversing said first data array and generating one or more of the plurality of outputs in response to the plurality of inputs to simulate the discrete function circuit design.

2. The method of claim 1, wherein said step of generating a multi-valued decision data representation comprises the steps of:

generating a first representation of a binary decision diagram (BDD), associated with one of the outputs of the discrete function circuit design, representing said effect of the two or more discrete function elements on the inputs;

repeating said step of generating a first representation, for each of said outputs;

combining two or more of said first representations of a BDD to create a second BDD representation, associated with two or more of said outputs of the discrete function circuit design, representing said effect of the two or more discrete function elements on the inputs; and converting said second BDD representation to said first multi-value decision diagram (MDD) representation.

3. The method of claim 2, further comprising the step of:

modifying said first data array by representing the effect of the two or more discrete function elements on all but one of the inputs wherein said one input does not affect said associated two or more outputs.

4. The method of claim 2, wherein said discrete function circuit design is a logic circuit design, and wherein said discrete function element is a logic gate.

5. The method of claim 4, wherein the logic circuit design is a layout level circuit design.

6. The method of claim 4, wherein the logic circuit design is a logic level circuit design.

7. The method of claim 4, wherein the logic circuit design is an architectural level circuit design.

8. The method of claim 2, further comprising the step of:

generating a simulation program, based upon said first data array, which simulates the effect of the two or more discrete function elements on the plurality of inputs.

9. The method of claim 8, wherein said step of generating said simulation program comprises the step of:

performing only one or more first data array lookup operations to simulate the effect of the discrete function elements on the inputs.

10. The method of claim 1, wherein said discrete function circuit design is a logic circuit design, and wherein said discrete function element is a logic gate.

11. The method of claim 10, wherein the logic circuit design is a combinational logic circuit design.

12. The method of claim 10, wherein the logic circuit design is a sequential logic circuit design.

13. The method of claim 12, further comprising the step of:

converting said sequential logic circuit into a combinational logic block having said two or more logic blocks.

14. The method of claim 13, further comprising the step of:

storing a sequential logic variable wherein said sequential logic variable is one of the outputs.

15. The method of claim 14, wherein the inputs into said combinational logic block include said sequential logic variable.

16. The method of claim 14, further comprising the step of:

eliminating a delay when simulating a first combinational logic block and a second combinational logic block by inputting a first plurality of inputs and said sequential logic variable into said first combinational logic block and inputting a second plurality of inputs and said sequential logic variable into said second combinational logic block.

17. The method of claim 1, further comprising the step of synthesizing and optimizing the discrete function circuit design before generating said first data array.

18. The method of claim 1, further comprising the step of:

pipelineing said discrete function circuit design to form two or more design stages, and generating said first data array for each of said stages.

19. The method of claim 1, wherein said data tables include a plurality of first data tables, each of said first data tables having a plurality of pointers, each of said pointers identifying a position of another of said data tables, and a second data table including said output values.

20. The method of claim 19, wherein said step of traversing said first data array includes the steps of:

(a) selecting one of said first data tables;
  (b) s electing a first subset of said inputs;
  (c) determining a first value representing said first subset of said inputs;
  (d) selecting one of said plurality of pointers of one of said first data tables, said selected pointer identifying the next data table;
  (e) repeating steps (b) through (d) until all of said inputs have been included in said first subset, wherein said pointer identifies said second table; and
  (f) identifying one or more of said plurality of outputs as a value of said second table.

21. The method of claim 1, wherein said step of generating a multi-valued decision data array includes the steps of:

generating a plurality of binary-valued decision data arrays, each representing the value of one of said outputs from said plurality of inputs;
  identifying a first group including two or more of said plurality of inputs;
  identifying a second group including two or more of said plurality of outputs; and
  combining two or more of said binary-valued data arrays associated with said first group and said second group to generate said multi-valued decision data array.

22. The method of claim 21, further comprising the step of eliminating unused inputs from said multi-valued decision data array.

23. A computer based system for simulating a circuit design having a plurality of signals representative of two or more logic gates, the two or more logic gates having a plurality of input signals and a plurality of output signals, comprising:

a storage device;
  MDD generating means, coupled to said storage device, for generating a multi-valued decision data representation having a plurality of nodes, representing the circuit design, a size of said multi-valued decision data representation is not dependent upon the number of discrete function elements, for generating a first representation of a binary decision diagram (BDD), associated with one of the outputs of the discrete function circuit design, representing said effect of the two or more discrete function elements on the inputs, for combining two or more of said first representations to create a second representation of a BDD, associated with two or more outputs, said second representation representing said effect of the two or more discrete function elements on the inputs, and for converting said second BDD representation to a first multi-value decision diagram (MDD) representation;
  first data array generating means, coupled to said storage device, and responsive to the logic gate signals, for generating signals representative of a first data array, wherein said first data array signals represents said MDD representation and an effect of the logic gate signals on the plurality of input signals, and wherein said first data array includes a plurality of data tables, each of said tables identified with one of said plurality of nodes, said first data array having a size that is not dependent upon the number of logic gates; and
  a processor, coupled to said data generating means, responsive to the input signals, wherein said processor generates an output signal based upon the effect of the first data array signals on the input signals.

24. The system of claim 23, wherein the circuit design is a sequential circuit design, further comprising:

a sequential logic converter, coupled to said storage device, for converting signals representative of the sequential circuit design into signal representative of a combinational logic block having said two or more logic gates and for storing one of the outputs corresponding to a sequential variable signal in said storage device.

25. The system of claim 23, wherein said sequential variable signal is one of the input signals.

26. The system of claim 23, further comprising:

traversing means, coupled to said processor, for selecting one of said first data tables, for selecting a first subset of said inputs, for determining a first value representing said first subset of said inputs, for selecting one of said plurality of pointers of one of said first data tables, said selected pointer identifying the next data table, and for identifying one or more of said plurality of outputs as a value of said second table.

27. A method for simulating a discrete function circuit design, on a digital computer, the discrete function circuit design including two or more discrete function elements, said discrete function circuit design having a plurality of inputs and a plurality of outputs, the method comprising the steps of:

generating a decision data representation having a plurality of nodes, representing the circuit design, a size of said binary-valued decision data representation is not dependent upon the number of discrete function elements, comprising the steps of:

generating a first representation of a binary decision diagram (BDD), associated with one of the outputs of the discrete function circuit design, representing said effect of the two or more discrete function elements on the inputs,
  repeating said step of generating a first representation, for each of said outputs, combining two or more of said first representations to create a second representation of a BDD, associated with two or more outputs, representing said effect of the two or more discrete function elements on the inputs, and converting said second representation to a first multi-value decision diagram (MDD) representation;

generating a first data array, using the digital computer, wherein said first data array represents said MDD representation and an effect of the two or more discrete function elements on the plurality of inputs, wherein said first data array includes a plurality of data tables, each of said tables identified with one of said plurality of nodes, said first data array having a size that is not dependent upon the number of discrete function elements; and traversing said first data array and generating one or more of said plurality of outputs in response to the plurality of inputs to simulate the discrete function circuit design.

28. The method of claim 27, wherein said data tables include a plurality of first data tables, each of said first data tables having a plurality of pointers, each of said pointers identifying a position of another of said data tables, and a second data table including said output values.

29. The method of claim 30, wherein said step of traversing said first data array includes the steps of:

(a) select one of said first data tables;

(b) selecting a first subset of said inputs;

(c) determining a first value representing said first subset of said inputs;

(d) selecting one of said plurality of pointers of one of said first data tables, said selected pointer identifying the next data table;

(e) repeating steps (b) through (d) until all of said inputs have been included in said first subset, wherein said pointer identifies said second table; and (f) identifying one or more of said plurality of outputs as a value of said second table.

30. The method of claim 27, further comprising the step of eliminating unused inputs from said first data array.

31. The method of claim 27, wherein said discrete function circuit design is a logic circuit design, and wherein said discrete function element is a logic gate.

32. The method of claim 31, wherein the logic circuit design is a combinational logic circuit design.

33. The method of claim 31, wherein the logic circuit design is a sequential logic circuit design.

34. The method of claim 33, further comprising the step of:

converting said sequential logic circuit into a combinational logic block having said two or more logic blocks.

35. The method of claim 34, further comprising the step of:

storing a sequential logic variable wherein said sequential logic variable is one of the outputs.

36. The method of claim 35, wherein the inputs into said combinational logic block include said sequential logic variable.

37. The method of claim 35, further comprising the step of:

eliminating a delay when simulating a first combinational logic block and a second combinational logic block by inputting a first plurality of inputs and said sequential logic variable into said first combinational logic block and inputting a second plurality of inputs and said sequential logic variable into said second combinational logic block.

38. The method of claim 27, further comprising the step of:

synthesizing and optimizing the discrete function circuit design before generating said data array.

39. The method of claim 27, further comprising the step of pipelineing said discrete function circuit design to form two or more design stages, and generating said data array for each of said stages.

* * * * *